United States Patent [19]

Yasumura et al.

[11] 4,339,792

[45] Jul. 13, 1982

[54] VOLTAGE REGULATOR USING SATURABLE TRANSFORMER

[76] Inventors: Masayuki Yasumura; Yoshio Ishigaki, both c/o Sony Corporation, 7-35, Kitashinagawa 6-chome, Shinagawa-ku, Tokyo, Japan

[21] Appl. No.: 138,341

[22] Filed: Apr. 8, 1980

[30] Foreign Application Priority Data

Apr. 12, 1979 [JP] Japan ................................ 54-44811

[51] Int. Cl.3 ......................... H01F 29/14; H03F 7/02

[52] U.S. Cl. ...................................... 363/75; 323/248; 323/250; 323/254; 323/334; 336/155; 336/184; 336/215; 363/91

[58] Field of Search ............... 323/248, 250, 254, 306, 323/329, 331, 334, 335, 338, 339; 336/155, 160, 170, 171, 184, 215; 363/75, 90, 91

[56] References Cited

U.S. PATENT DOCUMENTS

| | | | |
|---|---|---|---|
| 2,976,478 | 3/1961 | Aske | 336/170 X |
| 3,443,198 | 5/1969 | Wanlass | 323/250 X |
| 3,679,962 | 7/1972 | Wanlass | 323/248 X |
| 3,679,966 | 7/1972 | Wanlass | 323/248 |
| 3,683,269 | 8/1972 | Wanlass | 323/306 X |
| 3,894,280 | 7/1975 | Bishop et al. | 363/75 X |

*Primary Examiner*—A. D. Pellinen

[57] ABSTRACT

A voltage regulator using a saturable transformer comprises a transformer having a primary and secondary windings, an AC power source for supplying the primary winding a fluctuating alternating current, and a rectifier connected to the secondary winding for rectifying an AC voltage derived therefrom to produce a DC output voltage. The transformer includes a core having four legs and two common portions magnetically joining the four legs, and a control winding supplied with DC control bias from a control circuit. The primary and secondary windings are wound on the first and second legs and the control winding is wound on the first and third legs.

5 Claims, 28 Drawing Figures

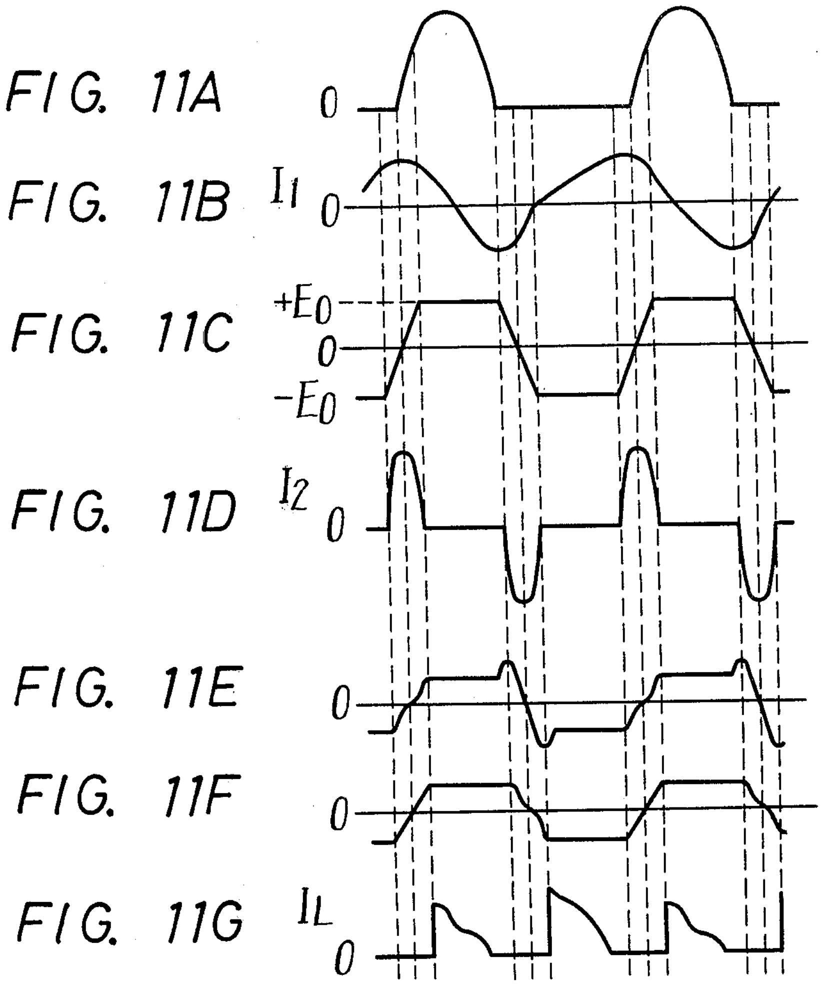
FIG. 13
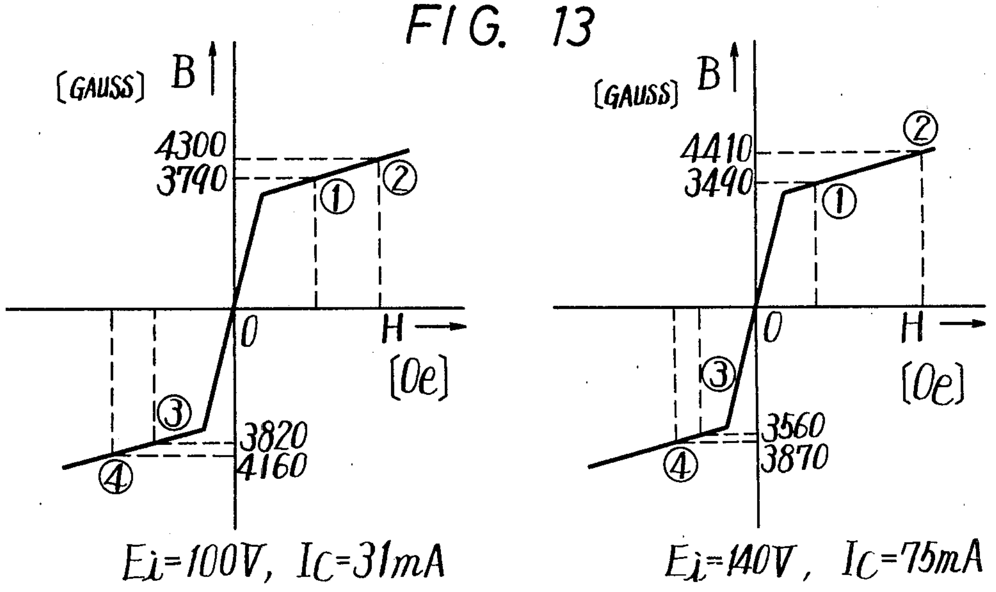

VOLTAGE REGULATOR USING SATURABLE TRANSFORMER

BACKGROUND OF THE INVENTION

1. Field of the Invention

This invention relates mainly to a voltage regulator using a saturable transformer, and particularly to a voltage regulator having superior constant voltage characteristic.

2. Description of the Prior Art

In a resonance circuit using a parametric oscillation shown in FIG. 1, when an inductance L is varied with a frequency which is twice the resonance frequency of this circuit, there is generated an oscillating current of a frequency equal to the resonance frequency. That is, if the inductance L is periodically changed with an exciting factor m expressed as follows:

$$L=L_o(1+m\cos 2\omega t)$$

where $m=L'/L_o$ (exciting factor)

$Q=\omega L_o/r$, $\omega=2\pi f$ r=internal resistance of resonance circuit, this circuit oscillates at an angular frequency $\omega$ when $m>2/Q$. The oscillating energy can be obtained as an output.

In this case, if the inductance L includes a saturated range (non-linear range) as shown in FIG. 2, the oscillating output is limited by the above non-linearity and hence a constant voltage output can be produced. An output voltage $E_o$ at this time is expressed as follows:

$$E_o = N\frac{d\Phi}{dt} = KN\omega SB_s$$

where

N: number of turns of winding having inductance L

K: form factor $\omega$: exciting angular frequency

S: effective sectional area of core wound with aforesaid winding $B_s$: effective maximum magnetic flux density of the aforesaid core Accordingly, if a transformer having a saturated range is used to perform parametric oscillation, for example, a DC-DC converter can be formed and also a constant voltage output can be produced.

In this case, however, when a silicon steel plate, permalloy or the like is used as a core material of the transformer, an exciting frequency f must be lowered to, for example, 50 Hz to 400 Hz for reducing eddy currents. Therefore, in order to provide an output having a certain magnitude, the sectional area S of core of the transformer or the number of turns, N, of the winding must be increased as apparent from the above equation. As a result, the transformer becomes large in size and heavy in weight so that the converter also becomes large in size and heavy in weight.

On the other hand, when a ferrite is used as the core material, the exciting frequency f can be taken as high as 15 KHz to 100 KHz. Therefore, the transformer can be made small in size and weight thereby to make the converter small in size and weight, too. However, the ferrite material has a drawback that if hysteresis loss causes heat generation, the maximum magnetic flux density $B_s$ of the core is greatly changed, for example, its variation $\Delta B_s$ becomes about 30% for the temperature variation of 0° C. to 100° C. As a result, the output voltage $E_o$ will be greatly changed.

Thus, in the prior art, a ferrite material is used as the core, and the exciting frequency f is controlled or another constant voltage circuit is added to make the output voltage $E_o$ constant. By these methods, however, the control range is narrow and the construction becomes complicated.

SUMMARY OF THIS INVENTION

Accordingly, it is an object of this invention to provide a voltage regulator free from the above drawbacks.

It is another object of this invention to provide a voltage regulator which is simple in construction and superior in constant voltage characteristic.

According to the main feature of this invention, a voltage regulator using a saturable transformer is provided which comprises a transformer having a core with four legs and two common portions magnetically joining the legs, primary and secondary windings which are wound on the first and second legs, and a control winding which is wound on the first and third legs. The voltage regulator further comprises an AC power source for supplying the primary winding a fluctuating alternating current, a rectifier connected to the secondary winding for rectifying an AC voltage derived therefrom to produce a DC output voltage, and a control circuit which includes an error detector for detecting deviations of the output voltage from a desired voltage and a biasing device for supplying a DC control bias to the control winding in response to a signal from the error detector.

The other objects, features and advantages of this invention will be apparent from the following description taken in conjunction with the accompanying drawings.

BRIEF DESCRIPTION OF THE DRAWINGS

FIGS. 11A to 11G, inclusive, FIG. 12 and FIG. 13 are views used for explaining the circuit of FIG. 10;

DESCRIPTION OF THE PREFERRED EMBODIMENTS

Prior to description of a voltage regulator of this invention, one example of a transformer for use therein will first be described.

Figure 3:
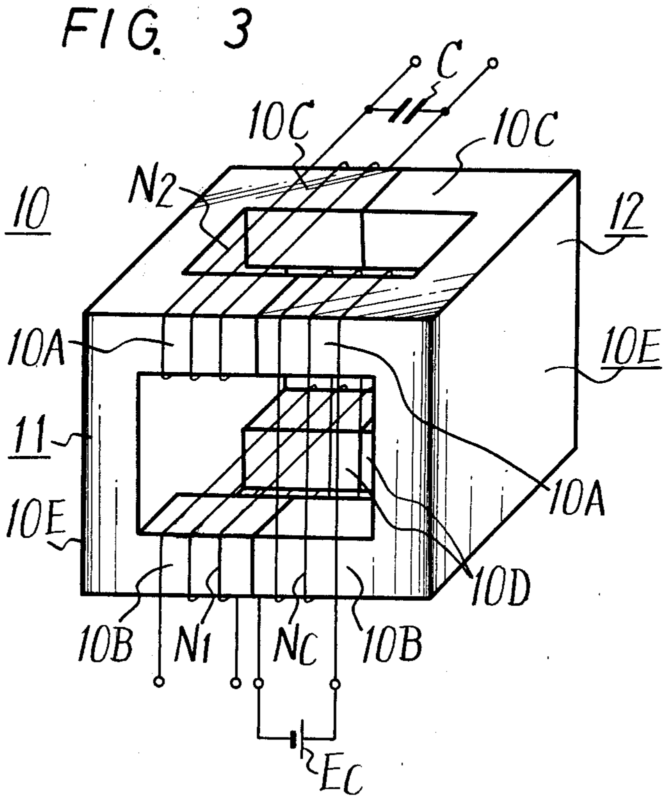
FIG. 3 and FIGS. 4A and 4B are perspective views showing the construction of a transformer used in this invention.

FIG. 3 shows a transformer 10 formed of a pair of magnetic cores 11 and 12, each having, for example, a square-plate core base 10E and four magnetic legs 10A, 10B, 10C and 10D respectively erected perpendicularly from four corners of core base 10E. Magnetic core 11 is arranged to oppose with magnetic core 12 so that the ends of legs 10A to 10D of the former are respectively brought into contact with those of the latter. As a result, transformer 10 is constructed as a whole in a shape of solid body or rectangular prism. Cores 11 and 12 are made of, for example, ferrite FE-3.

Figure 1:
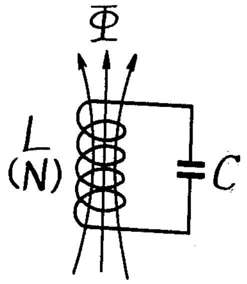
FIG. 1 PRIOR ART
FIG. 1 shows a resonance circuit used for explaining the parametric oscillation.
Figure 2:
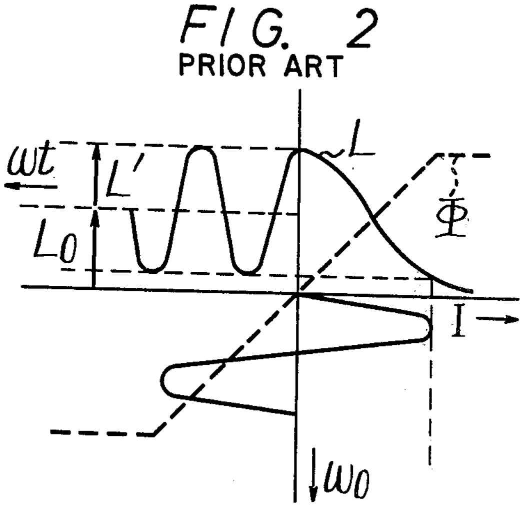
FIG. 2 PRIOR ART
FIG. 2 is a graph used for explaining the parametric oscillation.

A primary or exciting winding $N_1$ is wound extending over legs 10B and 10D of core 11, and a secondary or parametric oscillating winding $N_2$ (corresponding to inductance L of FIG. 1) is wound extending over legs 10A and 10C of core 11. Also, a control winding $N_c$ is wound extending over legs 10A and 10B of core 12. Therefore, windings $N_1$ and $N_2$ are of transformer coupling therebetween, and windings $N_1$, $N_2$ and winding $N_c$ are of orthogonal coupling therebetween. The coupling factor between windings $N_1$ and $N_2$ is in an order of 0.5 to 0.6. In FIG. 3, $E_c$ indicates a control voltage source.

Figure 4A:
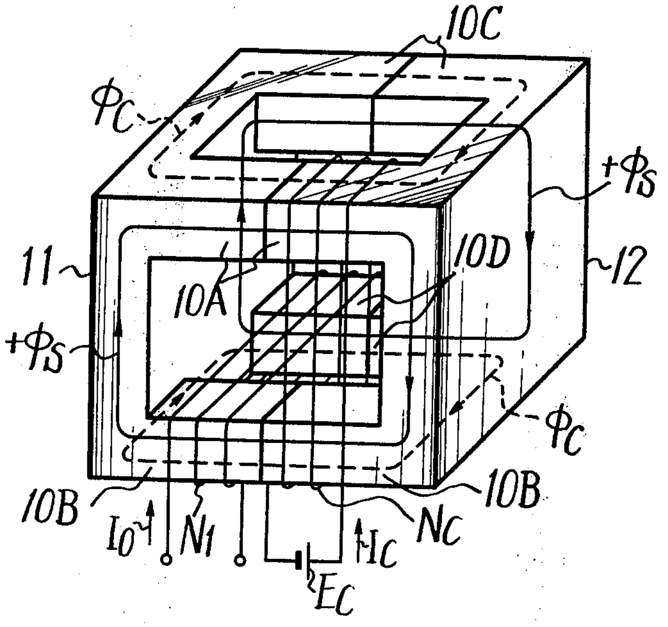
Figure 4B:
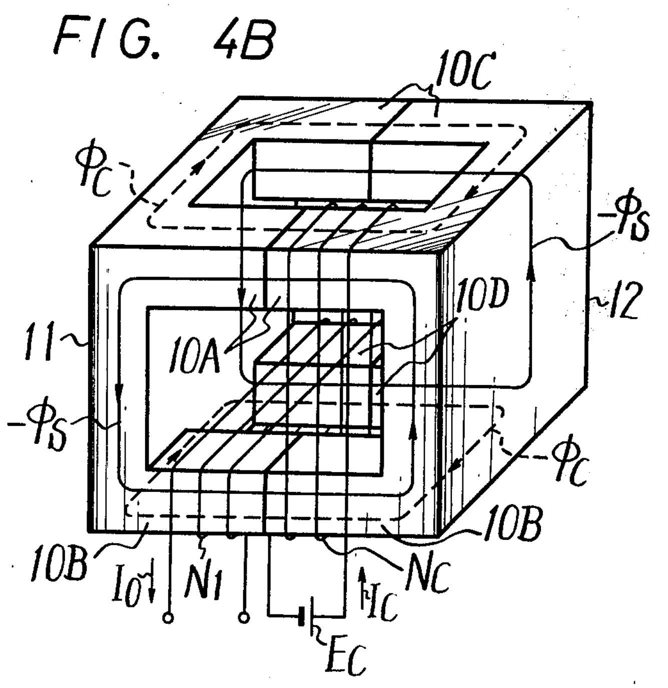

Transformer 10 as mentioned above has magnetic flux distribution mode as shown in FIGS. 4A and 4B, by way of example. If an exciting current and number of turns of winding $N_1$ are respectively taken as $I_1$ and $N_1$, an oscillating current and number of turns of winding $N_2$ as $I_2$ and $N_2$, and a load current and total exciting current derived from winding $N_2$ as $I_L$ and $I_0$, a total exciting magnetomotive force $N_1I_0$ of transformer 10 is given as follows:

$$N_1I_0=N_1I_1+N_2I_2+N_2I_L$$

Let it be assumed that magnetomotive force $N_1I_0$ produces magnetic flux $+\phi_s$ (FIG. 4A) during a period of positive half cycle of an output voltage $E_o$ and magnetic flux $-\phi_s$ (FIG. 4B) during a period of negative half cycle thereof, and control winding $N_c$ and control current $I_c$ flowing therethrough produce magnetic flux $\phi_c$. In this case, during the period of positive half cycle (FIG. 4A) magnetic fluxes $\phi_s$ and $\phi_c$ cancel each other in legs 10A and 10D, while in legs 10B and 10C magnetic fluxes $\phi_s$ and $\phi_c$ add to each other. During the period of negative half cycle (FIG. 4B) the above relationship is reversed.

Figure 5:
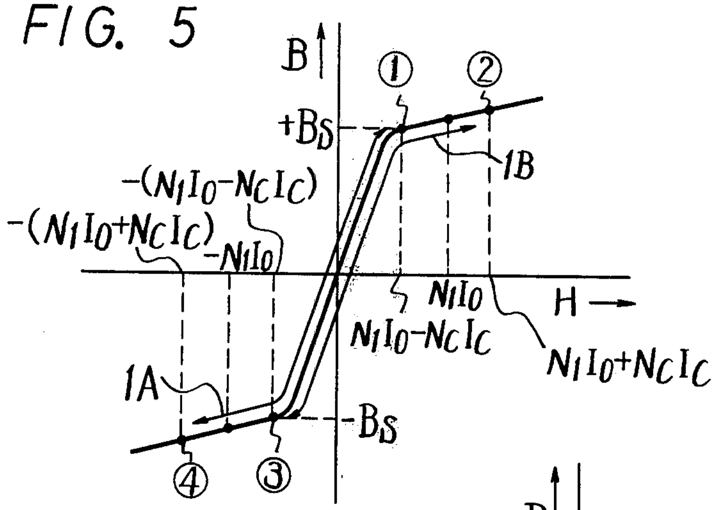
FIGS. 5, 7 and 8 are graphs showing B-H characteristics used for explaining the transformer of this invention.

Accordingly, the B-H characteristic curve of FIG. 5 shows that at the peak time point during the period of positive half cycle an operating point of legs 10A and 10D is a point ① and an operating point of legs 10B and 10C is a point ②, while at the peak time point during the period of negative half cycle an operating point of legs 10B and 10C is a point ③ and an operating point of legs 10A and 10D is a point ④. Thus, an operating range for legs 10A and 10D corresponds to a section shown by arrow 1A and an operating range for legs 10B and 10C corresponds to a section shown by arrow 1B. As a result, output voltage $E_o$ during the period of positive half cycle is determined by magnetic flux density $+B_s$ in legs 10A and 10D of point ① and output voltage $E_o$ during the period of negative half cycle is determined by magnetic flux density $-B_s$ in legs 10B and 10C of point ③.

Since points ① and ③ change according to the magnetic flux $\phi_c$ which is in turn changed according to the control current $I_c$, the output voltage $E_o$ can be controlled by controlling current $I_c$.

Figure 6:
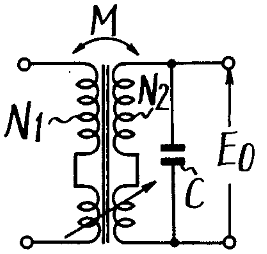
FIG. 6 is a view showing an equivalent circuit of the transformer used in this invention.

FIG. 6 shows an equivalent circuit of transformer 10. Output voltage $E_o(t)$ is expressed as follows:

$$E_o(t) = \frac{d}{dt}\Phi(t) = \frac{d}{dt}[L_2 \cdot i(t)]$$

$$= L_2\frac{di(t)}{dt} + i(t)\frac{dL}{dt}$$

$$= N_2\frac{d\Phi(t)}{dt} + i(t)\frac{dL}{dt}$$

where $L_2 \cdot i(t)=N_2 \cdot \Phi$, $L_2$ is inductance of $N_2$ In the above equation, the first term is a voltage induced by the transformer coupling and the second term is a voltage induced by the parametric coupling. In other words, the output voltage $E_o(t)$ contains a voltage caused by transformer coupling and a voltage caused by parametric oscillation. (The ratio between both voltages is changed according to the coupling factor between windings $N_1$ and $N_2$, or according to the shape of the cores and the winding methods.)

Figure 7:
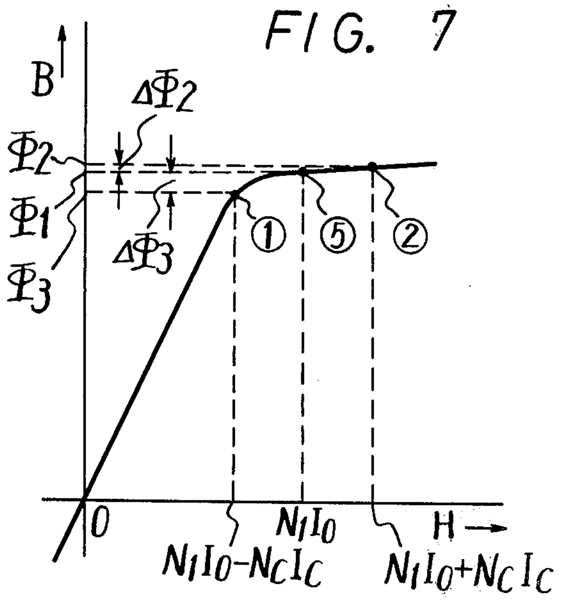

Accordingly, as shown in FIG. 7, if the magnetic flux from $I_c=0$ is taken as $\Phi_1$, the magnetic fluxes when added to each other as $\Phi_2$, the magnetic fluxes when subtracted from each other as $\Phi_3$, and deviations of the magnetic flux $\Phi_1$ from $\Phi_2$ and $\Phi_3$ as $\Delta\Phi_2$ and $\Delta\Phi_3$ respectively, an output voltage $e_0$ at $I_c=0$ is given as follows:

$$e_0 = N_2\frac{d(\Phi_1+\Phi_1)}{dt} + \frac{N_2}{L_2}(\Phi_1+\Phi_1)\frac{dL}{dt}$$

$$= 2\phi_1\left(KN_2f + \frac{N_2}{L_2}\frac{dL}{dt}\right)$$

When $I_c \neq 0$ and magnetic flux $\Phi_3$ is in the nonlinear region, an output voltage $e_{os}$ is given as follows:

$$e_{os} = N_2\frac{d(\Phi_2+\Phi_3)}{dt} + \frac{N_2}{L_2}(\Phi_2+\Phi_3)\frac{dL}{dt}$$

$$= [2\Phi_1 - (\Delta\Phi_3 - \Delta\Phi_2)]\left[KN_2f + \frac{N_2}{L_2}\frac{dL}{dt}\right]$$

Since B-H characteristics are nonlinear, $$\Delta\Phi_3 > \Delta\Phi_2$$

and hence $$e_0 - e_{os} = (\Delta\Phi_3 - \Delta\Phi_2)\left(KN_2f + \frac{N_2}{L_2}\frac{dL}{dt}\right)$$

Further, if operating point ② corresponding $\Phi_2$ and a point ⑤ corresponding to $\Phi_1$ are both assumed to be in the saturated region, $$\Delta\Phi_2 \cong 0$$

Therefore, the following relation is obtained.

$$e_0 - e_{os} = \Delta\Phi_3\left(KN_2f + \frac{N_2}{L_2}\ \frac{dL}{dt}\right)$$

The above equation reveals that if magnetic flux deviation $\Delta\Phi_3$ is controlled by control current $I_c$, the output voltage $E_o$ can be controlled.

In this case, the control sensitivity ($\Delta\Phi_3/\Delta I_c$) can be increased by using any of the following methods.

I. A magnetic material of rectangular hysteresis characteristic is used as cores 11 and 12.

II. Magnetic resistance of cores 11 and 12 is reduced. (For example, a gap between cores 11 and 12 is eliminated, a magnetic material of high permeability is used, the length of magnetic path is shortened, a sectional area of core is enlarged, and so on.)

As described above, if there is provided a control winding $N_c$ in orthogonal coupling to exciting and oscillating windings $N_1$ and $N_2$ and the control current $I_c$ flowing therethrough is changed, the maximum magnetic flux density $B_s$ of transformer 10 is controlled and as a result the output voltage $E_o$ can be controlled. If control current $I_c$ is controlled so as to prevent the variation of maximum magnetic flux density $B_s$ according to temperature, variation of input voltage, variation of load and the like from being influenced to the output voltage $E_o$, this output voltage can be stabilized.

Next, a consideration will be taken of the control range with the control current $I_c$.

Figure 8:
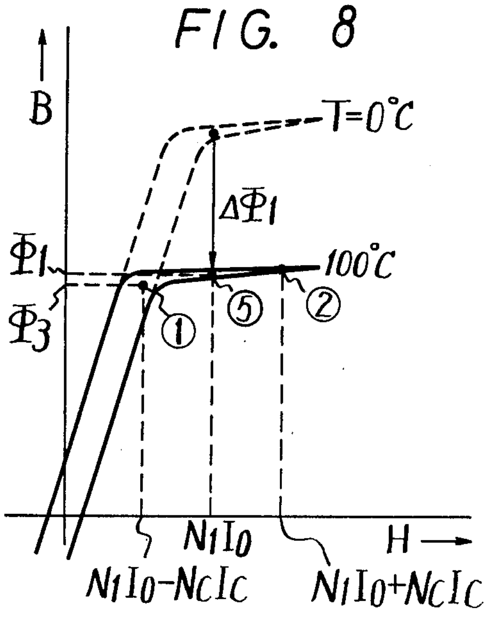

When ferrite material is used as cores 11 and 12, maximum magnetic flux density $B_s$ is greatly changed according to heat generation as described at the beginning. For example, as shown in FIG. 8, when temperature T is changed from 0° C. to 100° C., the magnetic flux density $B_s$ is decreased by $\Delta\Phi_1$=about 30%. Accordingly if an allowable temperature range is 0° C. to 100° C., it is necessary to set operating points ① to ⑤ on B-H curve at T=100° C.

Also, for the variations of input voltage and the variation of load, the constant voltage characteristic can be obtained if the following relation is established at operating point ①:

$$N_1I_0 - N_cI_c = \text{constant}$$

$$(\equiv NI \text{ being assumed})$$

Now, it is assumed:

$$N_1 = N_2 = N \text{ and,}$$

$$N_1I_0 = N_1I_1 + N_2I_2 + N_2I_L$$

From the above relation, the following equation is obtained:

$$I_c = \frac{N}{N_c}\left[(I_1 + I_L) + (I_2 - I)\right]$$

where $$I_1 = \left(\frac{L_2}{L_1R_L} + \frac{1}{j\omega L_1}\right) E_i$$

-continued $$I_L = -\frac{N_2}{N_1}\ \frac{E_i}{R_L}$$

Figure 9:
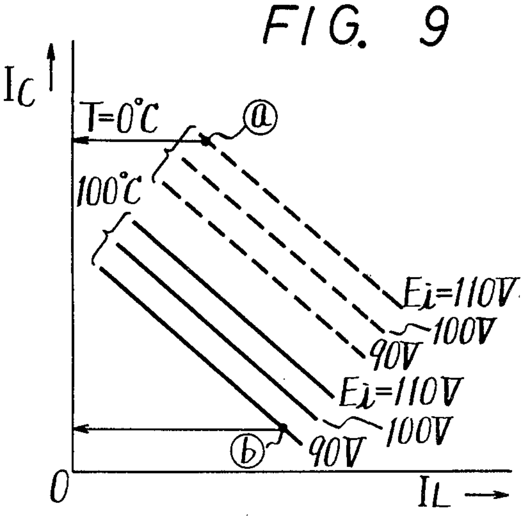
FIG. 9 is a graph used for explaining the transformer of this invention.

$L_1$: inductance of winding $N_1$
$L_2$: inductance of winding $N_2$
$E_i$: input voltage
$R_L$: load impedance
$I_L$: load current This equation will be illustrated in FIG. 9, Therefore, in consideration of the variation in maximum magnetic flux density $B_s$ according to temperature, control range according to control current $I_c$ can be established so that the maximum input voltage and minimum load may be obtained at a point ⓐ and the minimum input voltage and maximum load may be obtained at a point ⓑ.

This invention is adapted to construct a voltage regulator using these principles. One example of this voltage regulator according to the invention will hereinafter be described with reference to FIG. 10.

Figure 10:
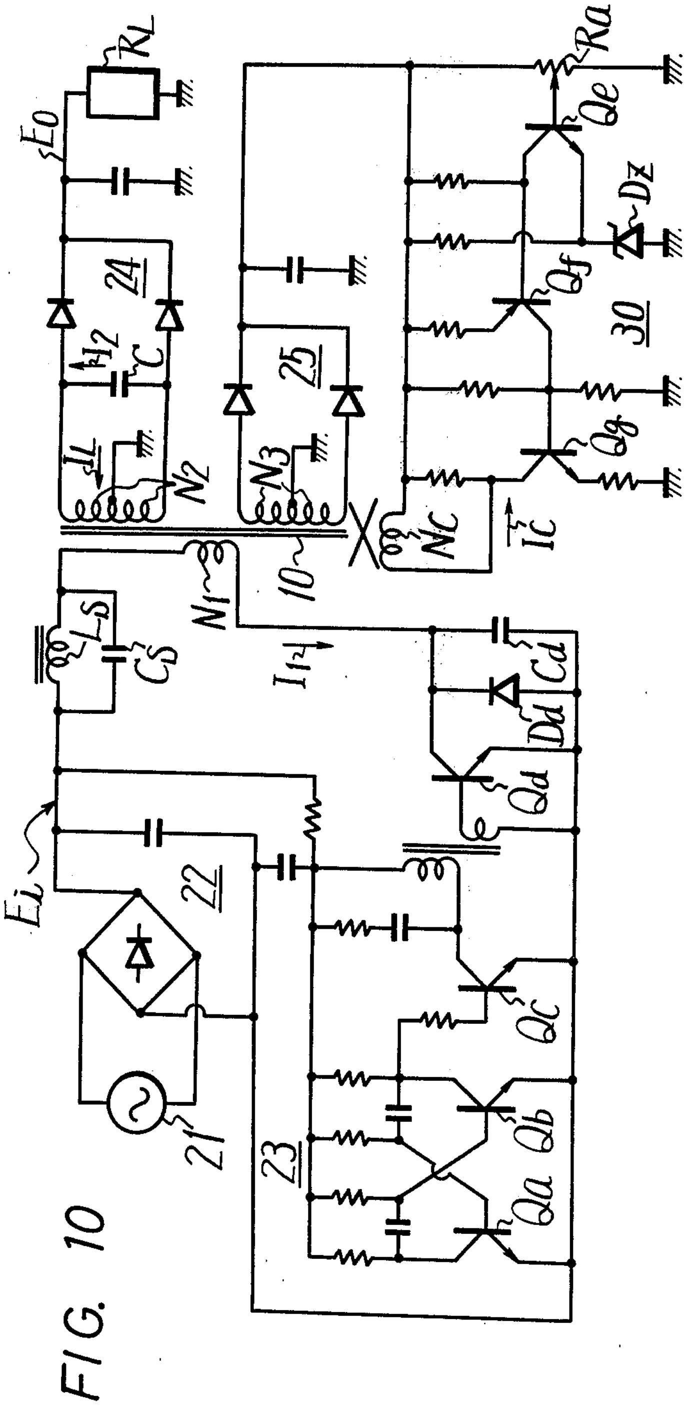
FIG. 10 is a connection diagram showing one example of a voltage regulator of this invention.

In FIG. 10, a commercial AC power source 21 of, for example, 100 V is provided with a rectifier circuit 22 for rectifying the AC voltage. Across rectifier circuit 22 is connected a series of a parallel resonance circuit consisting of a stabilizing choke coil $L_s$ and capacitor $C_s$, exciting winding $N_1$ of transformer 10, and the collector-emitter path of a switching transistor $Q_d$. The collector-emitter path of transistor $Q_d$ is connected in parallel with a switching diode $D_d$ and a resonance capacitor $C_d$, An astable multivibrator 23 is formed by transistors $Q_a$ and $Q_b$ to produce a pulse having a frequency in the order of, for example, 15 KHz to 20 KHz. This pulse is supplied through a driving transistor $Q_c$ to the base of transistor $Q_d$.

Across oscillating winding $N_2$ of transformer 10 is connected a resonance capacitor C and a rectifier circuit 24, which is in turn connected at its output end to a load $R_L$. In other words, a output voltage $E_o$ of winding $N_2$ is supplied through rectifier circuit 24 to load $R_L$.

Reference numeral 30 designates a control circuit whose control current $I_c$ is produced by detecting the magnitude of output voltage $E_o$. To this end, a winding $N_3$ is wound on transformer 10 similar to winding $N_2$ and a rectifier circuit 25 is connected across winding $N_3$. A rectified output of rectifier circuit 25 is supplied to control circuit 30 as its control voltage. The rectified output of rectifier circuit 25 is also supplied to a variable resistor $R_a$ to derive therefrom a divided output voltage, which is fed to the base of a detecting transistor $Q_e$. Meanwhile, a reference voltage obtained at a constant voltage diode $D_z$ is fed to the emitter of transistor $Q_e$ and is compared with the divided output voltage from variable resistor $R_a$. The compared output is supplied through a transistor $Q_f$ to the base of a transistor $Q_g$ the collector of which is connected to control winding $N_c$ of transformer 10.

Figure 12:
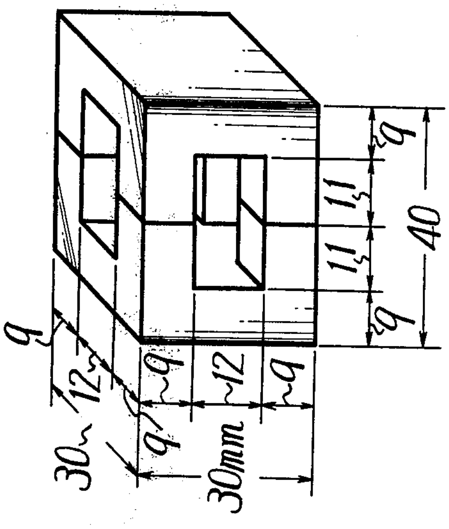

A practical numerical example and construction of transformer 10 are shown in FIG. 12 and as follows:

Core material: ferrite FE-3
Number of turns of winding $N_1$: 22
Number of turns of winding $N_2$: 22
Number of turns of winding $N_c$: 1200
Exciting frequency: 15.75 KHz
Capacitance of C: 0.049 μF According to the above construction, the output pulse of multivibrator 23 is applied to transistor $Q_d$ for switching it, so that a similar operation to the horizontal deflection circuit of a television receiver is carried out, and the collector voltage of transistor $Q_d$ exhibits a variation such as shown in FIG. 11A while exciting current $I_1$ is as shown in FIG. 11B and flows through exciting winding $N_1$ of transformer 10. In this case, choke coil $L_s$ is adapted to control the collector current flowing through transistor $Q_d$ during its ON time to stabilize its switching operation. Capacitor $C_s$ is adapted to form the resonance circuit, which resonates at the exciting frequency, together with coil $L_s$ so that a component of the collector voltage of transistor $Q_d$ will not affect the output voltage $E_o$.

Since transformer 10 is excited by current $I_1$, the output voltage $E_o$ and the resonance current $I_2$ shown in FIGS. 11C and 11D are obtained at the parallel circuit of the oscillating winding $N_2$ and capacitor C. This voltage $E_o$ is supplied to rectifier circuit 24 and hence a DC voltage of, for example, 115 V is supplied to load $R_L$.

FIGS. 11E and 11F show induced voltages in legs 10A, 10D and 10B, 10C, respectively, of transformer 10, and FIG. 11G shows a current $I_L$ flowing through a mid-tap of winding $N_2$ of transformer 10. This current $I_L$ is unbalanced between positive half cycle and negative half cycle because of the unbalanced condition of current $I_1$ as shown in FIG. 11B.

A voltage induced in winding $N_3$ is rectified by rectifier circuit 25 to derive therefrom a DC voltage of, for example, 18 V. The variation of this DC voltage is detected by transistor $Q_e$ and its detected output is supplied to winding $N_c$ of transformer 10 to cause control current $I_c$ to flow therethrough. In other words, if the output voltage of rectifier circuit 25 rises, the collector current of transistor $Q_e$ is increased and the collector current of transistor $Q_f$ is increased, so that control current $I_c$ of winding $N_c$ becomes large and the maximum magnetic flux density $B_s$ becomes small so as to lower the output voltage $E_o$. Meanwhile, if the output voltage of rectifier circuit 25 is lowered, the current $I_c$ becomes small and the magnetic flux density $B_s$ becomes large to increase the output voltage $E_o$. As a result, the output voltage $E_o$ will always be stabilized.

When a detection winding $N_c$ is would on each leg of transformer 10, its magnetic flux density $B_s$ can be calculated. That is, if a detected voltage is taken as e(t), $$e(t) = -n\frac{d\Phi}{dt} = -nS\frac{dB_s}{dt}$$

Therefore, $$B_s = -\frac{1}{2nS}\int_0^{\frac{t}{2}} e(t)dt$$

where n is the number of turns of winding $N_c$. For example, FIG. 13 shows calculation results of magnetic flux density B at a time when output voltage $E_o$ is 115 V and a power consumption $P_L$ of load $R_L$ is 70 W.

With the above-mentioned numerical example, when control current $I_c$ is selected in a range of 15 mA to 60 mA with respect to the variation of input voltage $E_i$ from 90 V to 120 V and the variation of load power $P_L$ from 30 W to 70 W, the output voltage $E_o$ was stable at 115 V. Further, when the input voltage $E_i$ and load power $P_L$ are fixed at 100 V and 70 W, respectively, the DC-DC conversion efficiency $\eta$ exclusive of rectifier circuit 22 was 81% and the power source ripple component at load $R_L$ was 50 mV (ripple suppression ratio 50 dB). When the control circuit 30 was disconnected, the ripple component was 200 mV.

Thus, according to this invention, stable voltage conversion can be carried out, and also, as apparent from the numerical example of FIG. 12, transformer 10 can be made remarkably small in size and weight so that the voltage regulator can be made compact and its weight lessened.

Further, choke coil $L_s$ serves as a load of transistor $Q_d$ even though the load $R_L$ is short-circuited by way of example, so that the transistor $Q_d$ is automatically protected against overload. In addition, no gap is necessary between magnetic cores 11 and 12 of transformer 10, so that most of the leakage flux disappears and other circuits will not be adversely affected.

Furthermore, in the above case, about 90% of the output is obtained by the transformer coupling and the remaining output is obtained by the parametric oscillation. If the shape of cores 11 and 12 and winding method of windings $N_1$ and $N_2$ are changed, however, all of the output can be obtained by the transformer coupling or parametric oscillation.

Figure 14:
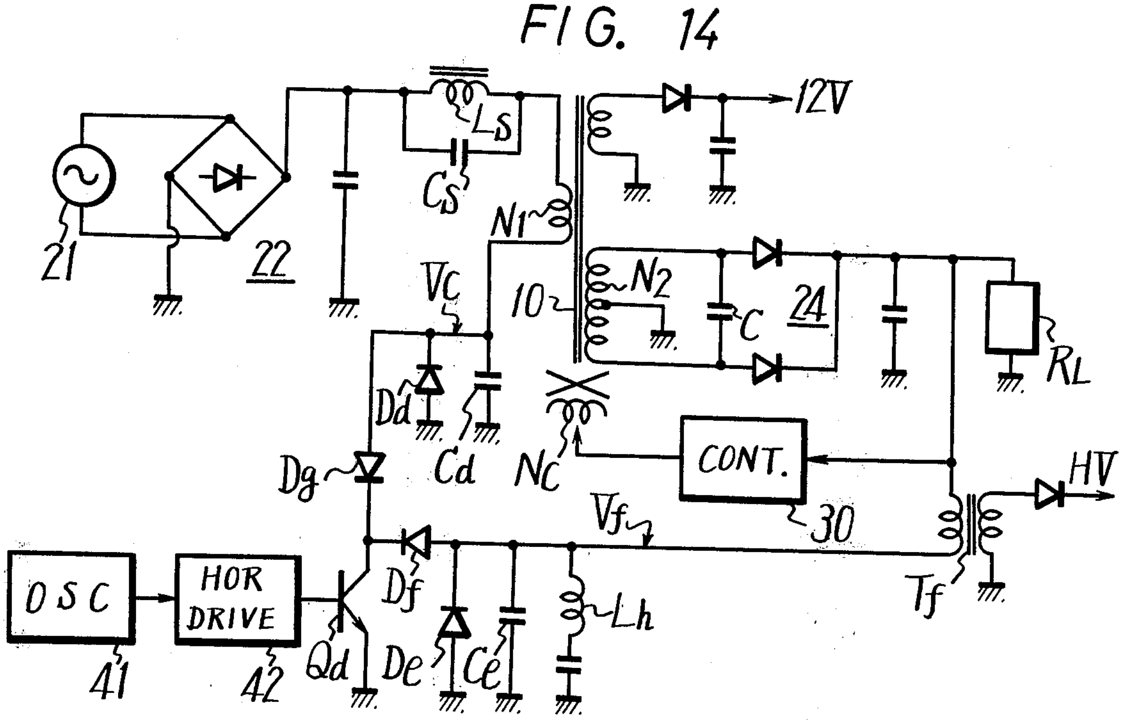
FIG. 14 is a connection diagram showing another example of this invention.

FIG. 14 shows another example of this invention, in which elements corresponding to those in FIG. 10 will be shown by the same reference numerals and characters. In this example, the horizontal deflection circuit of a television receiver is partially used in common. In FIG. 14, reference numeral 41 designates a horizontal oscillation circuit, 42 a horizontal drive circuit, $D_e$ a damper diode, $C_e$ a resonance capacitor, $L_h$ a horizontal deflection coil, $T_f$ a flyback transformer, and $D_f$ and $D_g$ reverse-current protecting diodes, respectively. In this example, a flyback pulse voltage $V_f$ is made equal to or greater than a converter pulse voltage $V_c$ ($V_f \geqq V_c$). When $V_f < V_c$, diodes $D_d$ and $D_g$ can be omitted.

Figure 15:
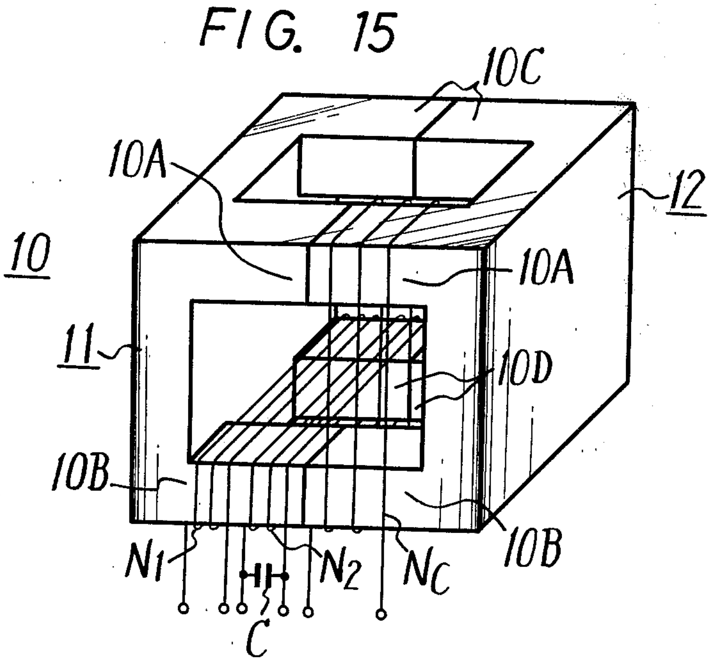
FIGS. 15 to 18, inclusive, are perspective views respectively showing another examples of the transformer of this invention.

FIGS. 15 to 18, inclusive, show another examples of transformer 10, in which winding $N_1$ is transformer-coupled to winding $N_2$ while windings $N_1$, $N_2$ are orthogonal-coupled to winding $N_c$. In the example of FIG. 15, windings $N_1$ are $N_2$ are both wound so as to extend over legs 10B and 10D of core 11 and the coupling factor k between windings $N_1$ and $N_2$ is selected to be 0.95 or more.

Figure 16:
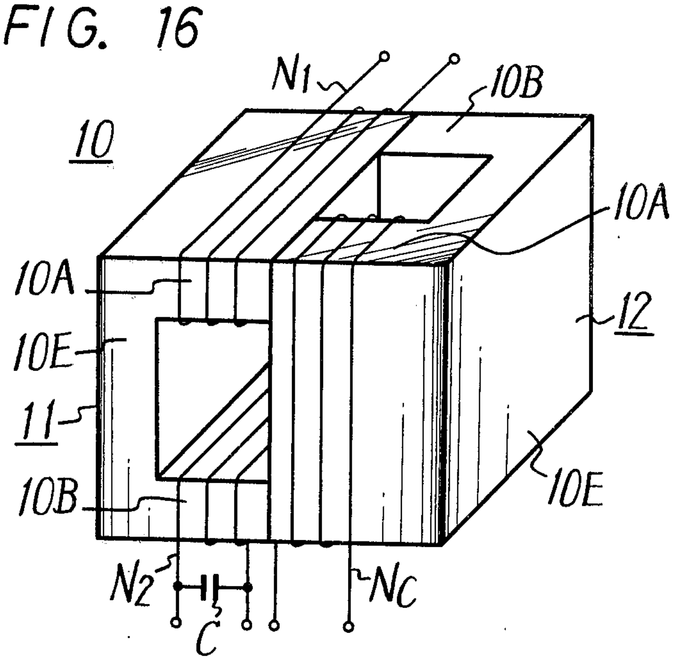

In the example of FIG. 16, cores 11 and 12 are each formed to have a C-shaped section and combined together to form a solid body or rectangular prism as a whole with both contacting sides being turned from each other by 90°. Legs 10A and 10B of core 11 are respectively wound with windings $N_1$ and $N_2$ while leg 10A of core 12 is wound with winding $N_c$ with the result that the coupling factor k becomes 0.5 to 0.6.

Figure 17:
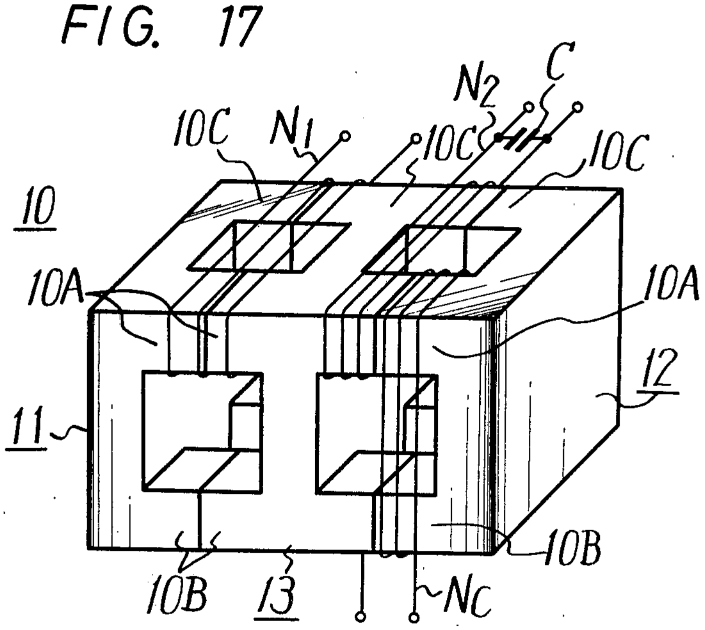
Figure 18:
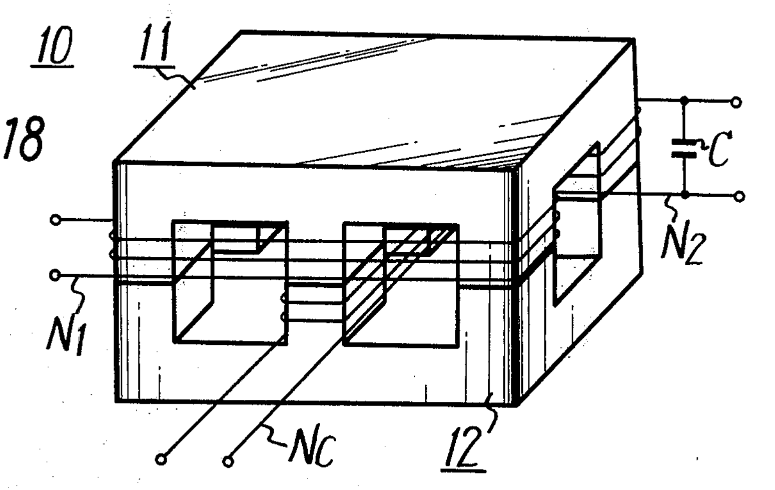

Further, in the example of FIG. 17, a third core 13 is provided between cores 11 and 12 as illustrated and the coupling factor k is made as 0.1. Winding $N_1$ is wound to extend over legs 10A, 10A and 10C, 10C of cores 11 and 13, and winding $N_2$ is wound to extend over legs 10A and 10C of core 13, while winding $N_c$ is wound to extend over legs 10A and 10B of core 12. In this example, windings $N_2$ and $N_c$ can be reversed in direction of winding. In the example of FIG. 18, transformer 10 is of a shell type with a coupling factor k=0.5 to 0.6.

Figure 19:
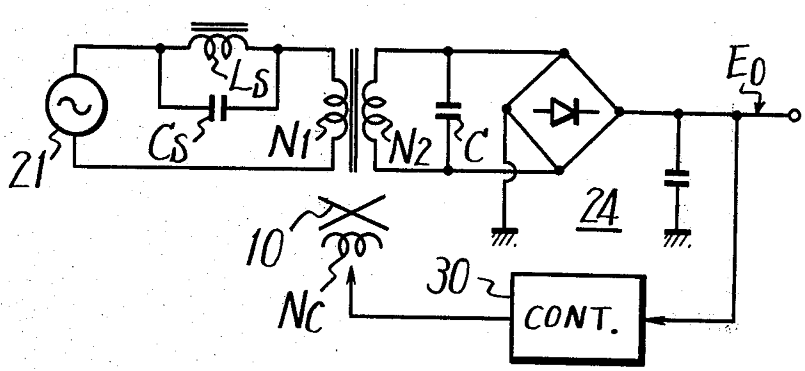
FIG. 19 is a connection diagram showing a further example of this invention.

FIG. 19 shows a further example of this invention, in which the exciting frequency is selected to be a commercial frequency 50 Hz to 400 Hz. In this case, the core material of transformer 10 is silicon steel plate, permalloy and the like.

In the examples described above, the operation of transformer 10 is explained with reference to FIG. 5, but the operating points in FIG. 5 can be changed.

Figure 20:
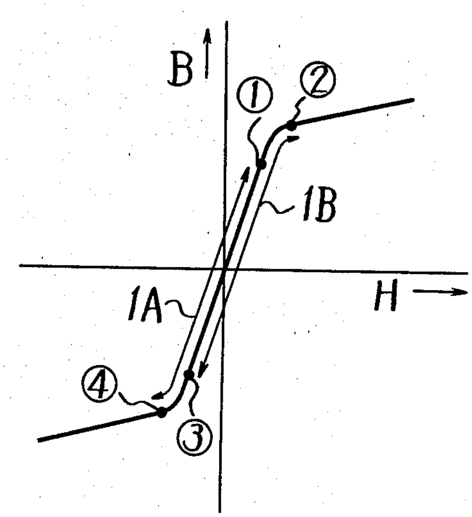
FIGS. 20 and 21 are graphs respectively used for explaining a further another example of this invention.
Figure 21:
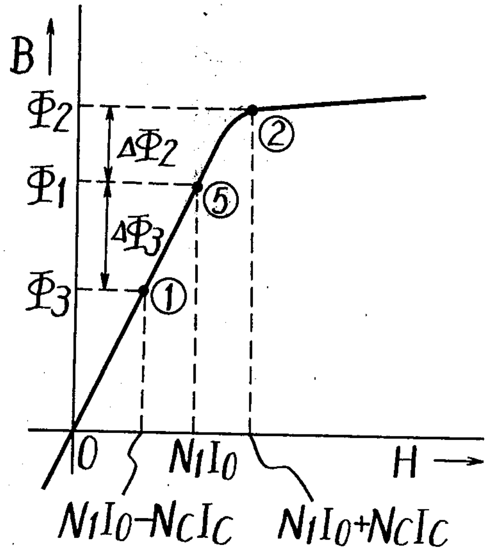

As shown in FIGS. 20 and 21, if operating points ① and ③, where magnetic fluxes $\phi_s$ and $\phi_c$ are subtracted, are in the linear region and the operating points ② and ④, where both magnetic fluxes are added, are in the non-linear region, the output voltage $e_o$ at $I_c=0$ is expressed as follows:

$$e_o = N_2 \frac{d}{dt} (\Phi_1 + \Phi_1)$$

While, output voltage $e_{os}$ at $I_c \neq 0$ with $\Phi_2$ in the non-linear region is expressed as follows:

$$e_{os} = N_2 \frac{d}{dt} (\Phi_2 + \Phi_3)$$

$$= N_2 \frac{d}{dt} [2\Phi_1 - (\Delta\Phi_3 - \Delta\Phi_2)]$$

Therefore, $$e_o - e_{os} = N_2 \frac{d}{dt} (\Delta\Phi_3 - \Delta\Phi_2)$$

$$= KN_2 f (\Delta\Phi_3 - \Delta\Phi_2)$$

Now, assuming that $$\Delta\Phi_3 >> \Delta\Phi_2$$

the following relation is obtained:

$$e_o - e_{os} = KN_2 f \Delta\Phi_3$$

Thus, $\Delta\Phi_3$ is changed according to control current $I_c$ for changing the output voltage $E_o$, so that a constant voltage output can be obtained.

Besides, in this case, since the magnetic flux density $B_s$ is decreased, the exciting current $I_1$ can be reduced and hence the iron losses of cores 11 and 12 and the copper losses of winding $N_1$ can be decreased. Accordingly, heat generation is decreased even in a prior art low-cost ferrite core, and also a radiator for transformer 10 and the stabilizing capacitor $C_s$ or the resonance capacitor C become unnecessary which result in cost reduction. (When capacitor C is not used, only the transformer coupling is used.)

According to experimental results, under the above conditions, the input power decreased 5 W and the efficiency rose 4%. The rise in temperature is not more than 30° C. resulting in a temperature decrease of 7° C.

The above operation mentioned with reference to FIGS. 20 and 21 can also be applied to all of transformers 10 described above.

It will be apparent that a number of changes and variations can be effected without departing from the scope of the novel concepts of this invention.

We claim as our invention:

1. A voltage regulator using a saturable transformer comprising:

a transformer including a ferromagnetic core having fours legs and two common portions magnetically joining said four legs, a primary winding wound on said first and fourth legs of said core, a secondary winding wound on said second and third legs of said core and a control winding wound on said first and second legs of said core such that no alternating flux is transferred from said primary winding to said control winding;

an AC power source for supplying said primary winding a fluctuating alternating current;

rectifier means connected to said secondary winding for rectifying an AC voltage derived therefrom to produce a DC output voltage; and control means including an error detector for detecting a deviation of said output voltage from a desired voltage and bias means for supplying a DC control bias to said control winding in response to a signal from said error detector.

2. A voltage regulator as set forth in claim 1, wherein said AC power source includes a fluctuating DC power source for supplying said primary winding a DC voltage, switching means connected to said primary winding, and drive means having an oscillator for driving said switching means ON and OFF.

3. A voltage regulator as set forth in claim 1, which further comprises a capacitor connected in parallel to said secondary winding to form a parametric resonant circuit.

4. A voltage regulator using a saturable transformer comprising:

a transformer including a first and a second C cores, said first C core being rotated approximately 90° with respect to said second C core, a primary and a secondary winding wound on said first C core and a control winding being wound on said second C core;

an AC power source for supplying said primary winding a fluctuating alternating current;

rectifier means connected to said secondary winding for rectifying an AC voltage derived therefrom to produce a DC output voltage; and control means including an error detector for detecting a deviation of said output voltage from a desired voltage and bias means for supplying a DC control bias to said control winding in response to a signal from said error detector.

5. A voltage regulator as set forth in claim 4, which further comprises a capacitor connected in parallel to said secondary winding to form a parametric resonant circuit.

* * * * *

UNITED STATES PATENT AND TRADEMARK OFFICE
CERTIFICATE OF CORRECTION

PATENT NO. : 4,339,792

DATED : July 13, 1982

INVENTOR(S) : Masayuki Yasumura et al.

It is certified that error appears in the above-identified patent and that said Letters Patent is hereby corrected as shown below:

On the title page add -- /73/ Assignee: Sony Corporation, Tokyo Japan --.

Signed and Sealed this

*Thirtieth* Day of *November 1982*

[SEAL]

*Attest:*

GERALD J. MOSSINGHOFF

*Attesting Officer* *Commissioner of Patents and Trademarks*